United States Patent [19]
Watarai

[11] Patent Number: 5,864,245
[45] Date of Patent: Jan. 26, 1999

[54] OUTPUT CIRCUIT WITH OVERVOLTAGE PROTECTION

[75] Inventor: Seiichi Watarai, Tokyo, Japan

[73] Assignee: NEC Corporation, Tokyo, Japan

[21] Appl. No.: 730,603

[22] Filed: Oct. 15, 1996

[30] Foreign Application Priority Data

Oct. 16, 1995 [JP] Japan ..................................... 7-266936

[51] Int. Cl.⁶ .................. H03K 19/0175; H03K 19/0948
[52] U.S. Cl. ................................................. 326/81; 326/86
[58] Field of Search ................................ 326/80–81, 83, 326/86, 121, 27, 68; 327/333

[56] References Cited

U.S. PATENT DOCUMENTS 5,004,936  4/1991  Andresen .................................. 326/27
5,406,140  4/1995  Wert et al. ................................. 326/68
5,444,397  8/1995  Wong et al. .
5,661,414  8/1997  Shigehara et al. ......................... 326/27

FOREIGN PATENT DOCUMENTS 0 630 109  12/1994  European Pat. Off. .

*Primary Examiner*—Jon Santamauro
*Attorney, Agent, or Firm*—Young & Thompson

[57] ABSTRACT

An output circuit comprises a transfer gate connected between an input terminal of the output circuit and an input of an output buffer circuit, a protection circuit for turning off a transistor constituting the output buffer when a potential higher than an operating source voltage of the output buffer circuit is applied to an output of the output buffer circuit, and a control circuit for turning on the transfer gate in response to a signal input to the input terminal and to turn for turning off the transfer gate when the protection circuit is actuated.

10 Claims, 2 Drawing Sheets

OUTPUT CIRCUIT WITH OVERVOLTAGE PROTECTION

BACKGROUND OF THE INVENTION

1. Field of the Invention

The present invention relates to an output circuit and, particularly, to an output circuit of an integrated circuit which has an output terminal applied with a voltage higher than a source voltage thereof and is operable at a low voltage.

2. Description of Prior Art

Responsive to shortened gate length of MOS transistors caused by increase of integrating density and increase of operating speed of an integrated circuit (LSI) composed of CMOS circuits or BiCMOS circuits, an operating source voltage thereof is being reduced. Under such circumstances, when such an LSI operable at low voltage is combined with an LSI operable at the usual voltage, an interface is required between the LSI having mutually different source voltages. When an LSI having a source voltage is connected to another LSI having a different source voltage and an output terminal of an output circuit of the LSI having the lower operating voltage is imparted with a potential higher than its source voltage, the output circuit includes an over-voltage protection circuit for preventing current from flowing from the side of the high potential LSI to the lower potential LSI to restrict variations of the source voltage and current of the lower potential LSI.

Referring to FIG. 4 which is a circuit diagram of a conventional output circuit, the conventional output circuit includes inverters 1 and 2 having inputs connected to an input terminal TI, an output buffer circuit 4 which is adapted to be driven by these inverters 1 and 2 and output an output signal in response to output signal from the inverters 1 and 2 at an output terminal TO and a protection circuit 7 which is adapted to cut off the output transistor P1 when an over-voltage is applied to the output terminal TO to thereby prevent current from flowing thereinto.

The output buffer circuit 4 includes a PMOS transistor P1 having a source connected to a power source VDD, a gate connected to an output of the inverter 1 and a drain connected to the output terminal TO and an NMOS transistor N6 having a source grounded to GND, a gate connected to an output terminal of the inverter 2 and a drain connected to the output terminal TO.

The protection circuit 7 has a terminal a connected to the output of the inverter 1, a terminal b connected to a power source VDD, a terminal c connected to a well of the transistor P1, a terminal d connected to the input terminal TI and a terminal e connected to the output terminal TO. The protection circuit 7 includes a PMOS type transistor P15 having a source connected to the output of the inverter 1 through the terminal a, a gate connected to the power source VDD through the terminal b and a drain connected to the terminal e, a PMOS type transistor P16 having a source connected to the terminal b, a gate connected to the output terminal TO through the terminal e and a drain and an well connected each other and further connected to the wells of the transistors P1 and P15 through the terminal c, respectively, and a PMOS type transistor P17 having a source connected to the output of the inverter 1 through the terminal a, a gate connected to the input terminal TI through the terminal d and a drain and an well connected each other and further connected to the well of the transistor P16.

Now, an operation of the output circuit shown in FIG. 4 from which the protection circuit 7 is removed will be described. Assuming that the transistor P1 of the output circuit 4 is in ON state and the transistor N6 of the same is in OFF state, a potential of the output terminal TO is equal to that of the power source VDD. When, in this state, a high potential (referred to as "VPP", hereinafter, for simplicity of description) higher than the power source potential VDD is applied to the output terminal TO, a current path is formed from the output terminal TO through the transistor P1 to the power source VDD, causing a potential variation and/or current variation of the power source VDD to be induced. Further, it is well known that, when a well potential of the PMOS type transistor is lower than its source potential, not only a threshold value of the transistor varies but also a current path is formed from the source to a substrate, which cause the transistor itself to be degraded and cause a power consumption of a circuit including the transistor. Therefore, the well potential must be substantially the same as the source potential.

The protection circuit 7 is provided to prevent the current path described above from being formed. When the potential VPP is supplied to the terminal TO while To is outputting the potential VDD, the transistor P15 turns on because the source potential thereof becomes higher than a gate potential thereof. Therefore, the potential VPP supplied to the terminal TO is propagated to the gate electrode of the transistor P1 through the transistor P15 to thereby cut off the transistor P1. The transistor P17 is provided to make the well potentials of P1 and P15 to equal to the corresponding source potentials of P1 and P15, respectively to thereby prevent current flowing between the well region and the source region.

Further, the transistor P16 is provided to maintain the well potentials equal to the power source potential VDD when the output terminal TO is a ground potential GND.

When the output buffer outputs VDD level, the inverter outputs L level (ground level GND) to turn on P1. Therefore, a N-channel transistor of the inverter is in ON state. As a result, a current path from the terminal TO to the ground line through P15 and the N-channel transistor of the inverter is made.

Particularly, in the output circuit in a LSI which is operable at high speed, the output transistor having large channel width is used in the output buffer thereof. In order to drive such transistor having large channel width, the drive inverter is formed by using transistor having large channel width. Therefore, the current flowing from the output terminal TO to the ground GND becomes large, causing the problem of current consumption and heat generation to occur.

SUMMARY OF THE INVENTION

An object of the present invention is to provide an output circuit which is free from the problem of current consumption and heat generation when a potential higher than a potential of a power source of the output circuit is applied to an output terminal of the output circuit which is operating at the source potential.

In order to achieve the above object, an output circuit according to the present invention which has an output buffer circuit including first and second transistors responsive to high and low levels of an input signal to switch a level of an output signal output at an output terminal to a power source or a ground and a protection circuit for turning the first transistor OFF when an over-voltage higher than the power source voltage is applied to the output terminal, comprising:

a transfer gate for switching a control signal of the first transistor correspondingly to the input signal; and a protection control circuit for turning the transfer gate OFF when the over-voltage is detected in response to the input of the input signal.

DETAILED DESCRIPTION OF THE PREFERRED EMBODIMENTS

Figure 1:
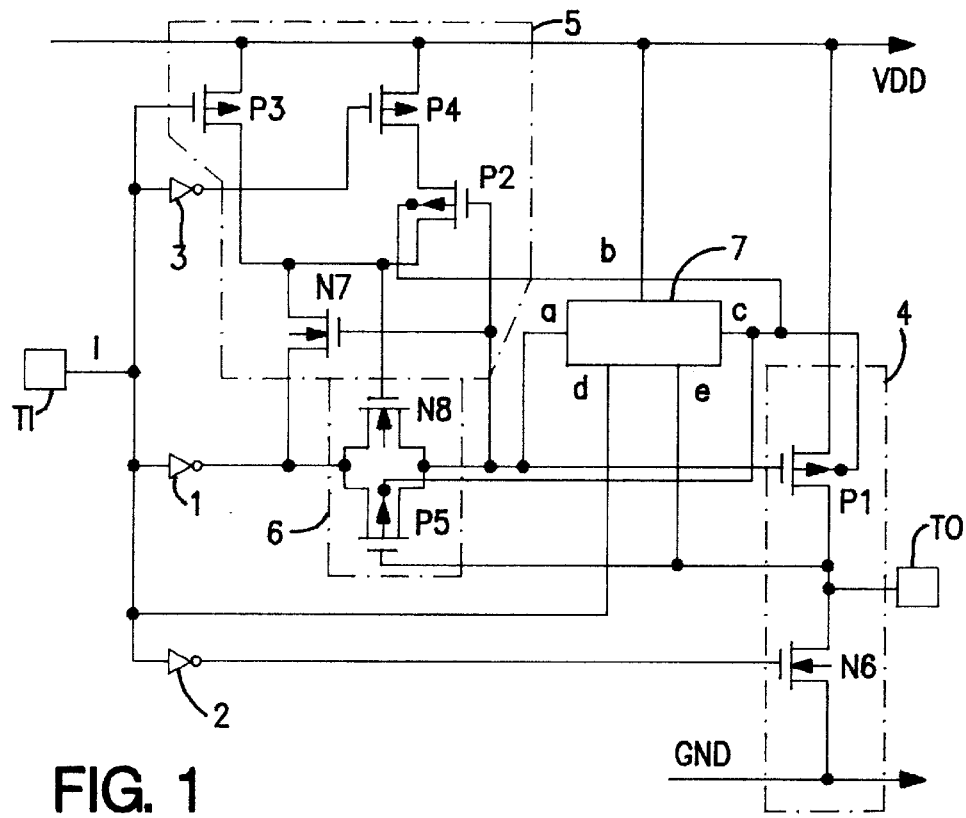
FIG. 1 is a circuit diagram of an output circuit according to a first embodiment of the present invention.
Figure 4:
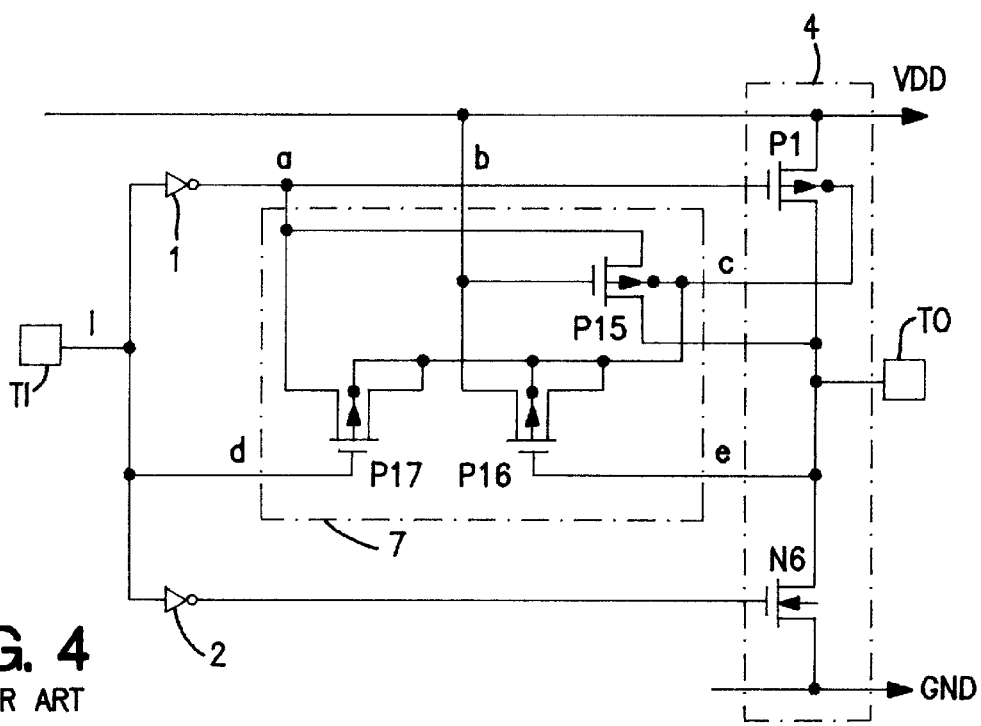
FIG. 4 is a circuit diagram of an example of a conventional output circuit.

FIG. 1 shows an embodiment of the present invention, in which constructive elements commonly used in FIG. 4 are depicted by the same reference numerals, respectively. An output circuit shown in FIG. 1 comprises, in addition to inverters 1 and 2, an output buffer circuit 4 and a protection circuit 7 which are the same as those of FIG. 4, an inverter 3 having an input connected to an input terminal TI, a protection control circuit 5 and a transfer gate 6 having an input connected to an output of the inverter 1 and an output connected to a gate of a transistor P1 of the output buffer circuit 4.

The protection control circuit 5 includes a PMOS type transistor P3 having a source connected to a power source VDD and a gate connected to the input terminal TI, a PMOS transistor P4 having a source connected to the power source VDD and a gate connected to the output of the inverter 3, a transistor P2 having a source connected to a drain of the transistor P4, a gate connected to the output of the transfer gate 6 and the gate of the transistor P1, a drain connected to the drain of the transistor P3 and a well connected to the well of the transistor P1 and an NMOS transistor N7 having a source connected to the output of the inverter 3, a gate connected to the gate of the transistor P2 and a drain connected to the drain of the transistor P2.

The transfer gate 6 includes a PMOS transistor P5 having a gate connected to the output terminal TO and a well connected to the well of the transistor P1 and an NMOS transistor N8 having a gate connected to the drain of the transistor P2 and a source and a drain connected, respectively, to the source and the drain of the transistor P5 to form an input and an output thereof.

The protection circuit 7 is the same as that of the conventional output circuit except that a terminal a is connected to the output of the transfer gate 6.

An operation of the embodiment shown in FIG. 1 will be described. The input terminal is supplied with an input signal having an amplitude from an L level corresponding substantially to the ground potential to an H level corresponding substantially to the power source potential VDD. When the input signal I is changed from the L level to the H level, the transistor P3 is switched from ON to OFF and each of the outputs of the inverters 1, 2 and 3 is changed from H level to L level. Therefore, the transistor P4 of the protection control circuit 5 is switched from OFF to ON and the transistor N6 is switched from ON to OFF. In a process of this transition, the gate of the transistor P5 of the transfer gate 6 is still supplied with a low potential from the output terminal TO so that the transistor P5 is still in the ON state. Therefore, the L level output of the inverter 1 is supplied to the gate of the transistor P1 to turn the transistor P1 ON to thereby change the level of the output terminal TO from L to H level. Simultaneously, the transistor P2 of the protection control circuit 5 is turned ON and the source potential VDD is supplied to the gate of the transistor N8 through the transistors P4 and P2. Therefore, the ON state of the transistor N8 is maintained. Since, the transistor N8 is kept ON even when the output terminal TO becomes the high potential so that the transistor P5 is turned OFF, the output terminal TO is maintained at H level.

In this state, when the potential VPP higher than the source potential VDD is applied from an LSI connected to the output terminal TO, the transistor P1 is turned OFF so that the current path from TO to VDD is cut off because the H level of TO is supplied through P15 of the protection circuit 7 to the gate electrode of P1. Simultanesouly, the transistor P2 of the protection control circuit 5 is turned OFF and the transistor N7 is turned ON to discharge the gate of the transistor N8 to thereby turn N8 OFF quickly. Since the transistor P5 connected in parallel to the transistor N8 has been turned OFF at the time when the potential of the output terminal TO was changed from the L level to the H level, the transfer gate 6 constituted with the transistor P5 and the transistor N8 is completely turned OFF. Therefore, the current path from the output terminal TO to GND through P15 and the inverter 1 is cut off while P15 is turned ON.

At this time the potential of the terminal a of the protection circuit 7 is increased up to VPP, the transistor P17 having the gate supplied directly with the input signal I in H level is turned ON and the terminal c is kept at VPP. Therefore, the well potentials of the transistors P1, P2, P5, P15, P16 and P17 are kept at the potential VPP of the output terminal TO.

When the input signal I becomes L level and the potential of the output terminal TO becomes L level, that is, the ground potential GND, the GND potential is applied to the terminal e connected to the output terminal TO. Therefore, the transistor P15 having the gate supplied with VDD is turned OFF and the transistor P16 having the gate supplied with the ground potential GND is turned ON. Thus, the potential of the terminal c becomes VDD through the transistor P16. Therefore, the well potential of the transistors P1, P2, P5, P15, P16 and P17 are kept at the source potential VDD. Since the transistor P17 having the gate supplied with the input signal I in L level is kept ON and the terminal a connected to the inverter 1 is made H level, the transistor P16 is turned ON to keep the potential of the terminal c at VDD.

Now, a second embodiment of the present invention will be described with reference to FIG. 2 in which constructive elements commonly used in FIG. 1 are depicted by the same reference numerals, respectively. A difference of the second embodiment from the first embodiment is that an output buffer circuit 4A includes, in addition to the transistors P1 and N6 of the output buffer circuit 4 of the first embodiment, an NPN transistor Q1 having a collector connected to the power source VDD, a base connected to the source of the transistor P1 and an emitter connected to the output terminal TO and a buffer circuit 8 having an input connected to the input terminal TI and an output connected to the base of the transistor Q1 and the source of the transistor P1.

Figure 2:
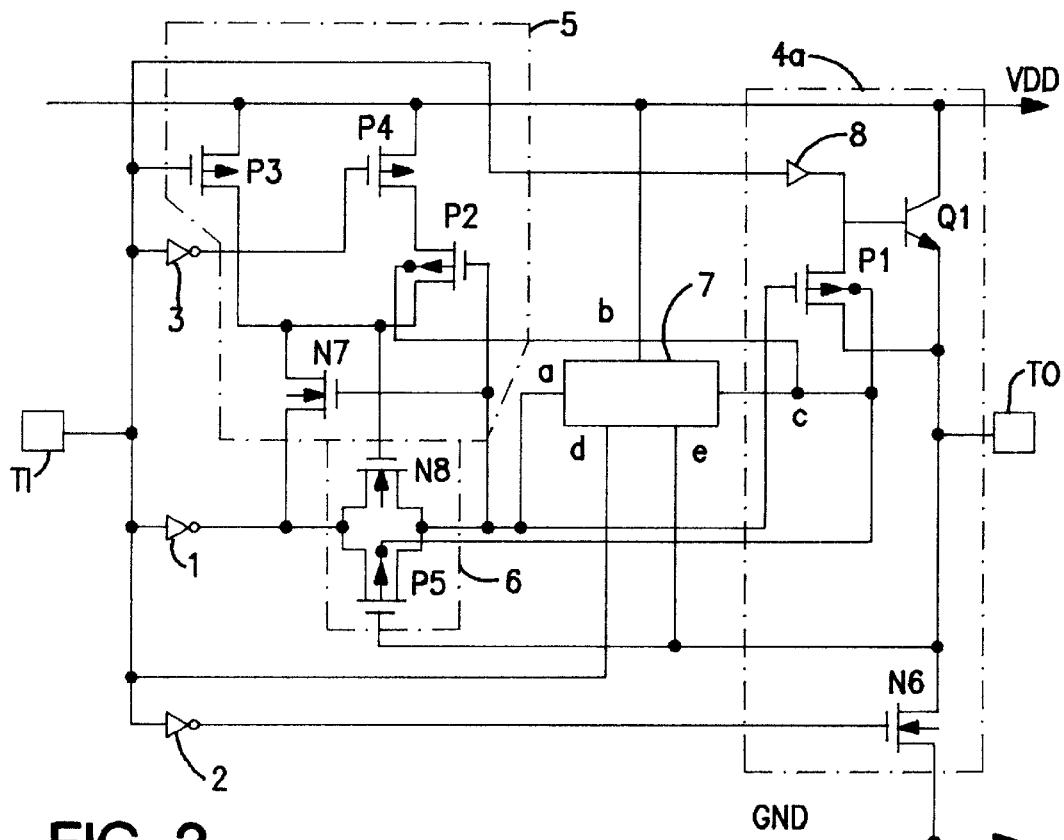
FIG. 2 is a circuit diagram of an output circuit according to a second embodiment of the present invention.

Describing an operation of the second embodiment with reference to FIG. 2, when the input signal I is changed from L level to H level, the transistor P3 of the protection control circuit 5 is switched from ON to OFF, the outputs of the respective inverters 1, 2 and 3 are changed from H level to L level and the output of the buffer circuit 8 is changed from L level to H level. Therefore, the transistors P4, N6 and Q1 are turned ON, OFF and ON, respectively.

Similarly to the first embodiment, since the transfer gate 6 is still in the conduction state, the low level output of the inverter 1 is supplied to the gate of the transistor P1 to turn the latter ON. Simultaneously, the transistor P2 is turned ON to maintain the transfer gate 6 in the conduction state. Therefore, the level of the output terminal TO is changed from L to H. However, since a forward voltage is supplied between the base and the emitter of the transistor Q1 by the transistor P1 in ON state, the transistor Q1 is turned ON at very high speed. Further, due to the transistor P1 in ON state, the output level of the output terminal TO which is dropped by the forward voltage of the transistor Q1 is pushed up to the source voltage VDD.

In this state, when the potential VPP higher than the source potential VDD is inputted from another LSI to the output terminal TO, the transistor P1 is turned OFF completely since its gate voltage is made equal to the voltage of the output terminal TO and the current is prevented from flowing through the buffer circuit 8 to the power source VDD by the function of the proection circuit 7. Simultaneously, the transistor P2 is turned OFF to remove the gate potential of the transistor N8, so that the transfer gate 6 is changed from the conduction state to the non-conduction state. Thus, the current path from the output terminal TO is completely blocked to block the current flow from the output terminal TO.

Since, in the second embodiment, a load driving element connected to the output terminal TO is the NPN transistor Q1, it is possible to obtain a load driving performance which is very large compared with that of the first embodiment. Further, since, in order to switch the transistor Q1 from OFF to ON quickly, the smaller the ON resistance of the transistor P1 is better, it is possible to make the element size of the transistor P1 small. Therefore, it is possible to make the sizes of the transistors N8 and P5 of the transfer gate 6 for driving the transistor P1 and the inverter 1 small. Thus, it is possible to reduce an area occupied by the elements constituting the output circuit and to reduce the power consumption of the output circuit.

Figure 3A:
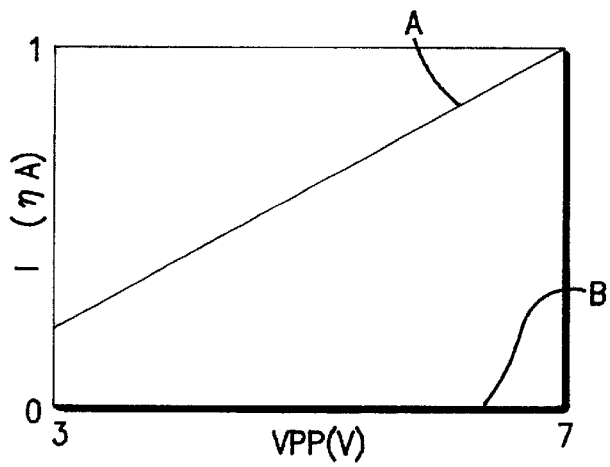
FIG. 3(A) is a graph showing a relation between an over-voltage applied to an output terminal of the output circuit according to the first or second embodiment and a current flowing from the output terminal of the circuit therethrough.

FIG. 3(A) shows simulation waveforms of the ground current when VPP greater than VDD (3V) is supplied to TO. The curve A stands for the prior art circuit and the curve B stands for the first and second embodiment of this invention, respectively. In prior art, the current consumption increases proportionally to VPP. In contrast, the current consumption of this invention circuit is substantially zero.

Figure 3B:
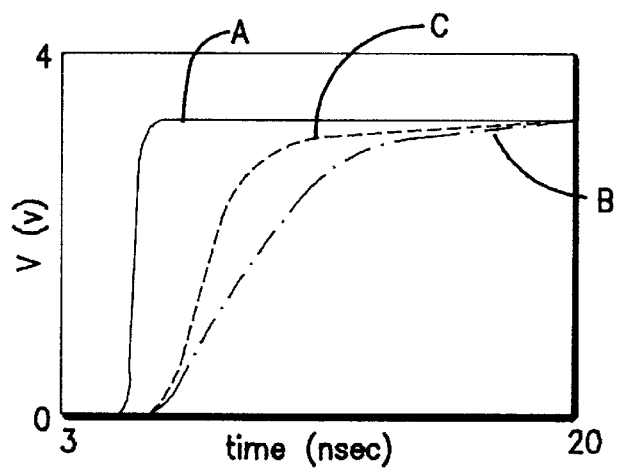
FIG. 3(B) shows waveforms simulating output waveforms of the output circuit.

FIG. 3(B) shows output voltage waveforms of the first and second embodiment of this invention. The curves A, B and C stand for input voltage, the first embodiment and the second embodiment, respectively. The curve C improves a delay time by about 46% with respect to the curve B.

As described hereinbefore, the output circuit of the present invention which includes a transfer gate for supplying a control signal corresponding to an input signal to an output transistor and a protection control circuit for closing the transfer gate when an over-voltage is applied to an output terminal can prevent a current from flowing into a power source thereof as well as its ground when the over-voltage is applied to the output terminal. Therefore, it is possible to substantially reduce power consumption and substantially reduce a junction temperature of each of elements constituting an integrated circuit.

What is claimed is:

1. An output circuit comprising:
   an input terminal;
   an output buffer circuit including a series connection of output transistors and an output terminal for outputting potentials of a first power source terminal and a second power source terminal as logical levels;
   a transfer gate provided between said input terminal and an input to said output transistors;
   a protection circuit adapted to be actuated when a potential higher than the potential of said first power source terminal is applied to said output terminal to turn said output transistors off; and
   a control circuit for turning said transfer gate on in response to a signal input to said input terminal and turning said transfer gate off when said protection circuit is actuated.

2. An output circuit as claimed in claim 1, wherein said output transistors of said output buffer circuit comprises a P channel output MOS FET and an N channel output MOS FET.

3. An output circuit as claimed in claim 2, wherein said transfer gate comprises a P channel MOS FET and an N channel MOS FET connected in parallel to said P channel MOS FET and is connected between said input terminal and an input gate of said P channel output MOS FET, said P channel MOS FET having a gate connected to said output terminal and said N channel MOS FET having a gate connected to an output of said control circuit.

4. An output circuit as claimed in claim 3, wherein said control circuit is adapted to keep said N channel MOS FET on when an input potential to said transfer gate is low level and no potential higher than a potential of said first power source terminal is applied to said output terminal and to turn said N channel MOS FET off when the input potential to said transfer gate is low level and a potential higher than the potential of said first power source terminal is applied to said output terminal.

5. An output circuit as claimed in claim 4, wherein said control circuit keeps said N channel MOS FET always on when the input potential of said transfer gate is high level.

6. An output circuit as claimed in claim 5, wherein said output buffer circuit further comprises an NPN bipolar transistor having an emitter connected to said output terminal, a base connected to said input terminal and a source of said P channel output MOS FET and a collector connected to said first power source terminal.

7. An output circuit as claimed in claim 6, wherein said protection circuit is adapted to output a potential higher than the potential of said first power source terminal to a well of said P channel output MOS FET when a potential higher than the potential of said first power source terminal is detected at said output terminal and apply the potential of said first power source terminal to a well of said P channel MOS FET when the potential of said output terminal is not higher than the potential of said first power source terminal.

8. An output circuit having an output buffer circuit including first and second transistors responsive to high and low levels of an input signal input at an input terminal to switch a level of an output signal output at an output terminal to a power source or a ground, and a protection circuit for turning said first transistor off when an over-voltage higher than the power source voltage is applied to said output terminal, said output circuit further comprising:

a transfer gate for switching a control signal of said first transistor correspondingly to the input signal; and a control circuit for turning said transfer gate off when the over-voltage is detected in response to the input signal.

9. An output circuit as claimed in claim 8, further comprising first, second and third inverters having inputs connected to said input terminal for outputting first, second and third inverted input signals, respectively, and wherein:

said first transistor is a first P channel MOS transistor having a source connected to said power source, a gate connected to an output of said first inverter and a drain connected to said output terminal and said second transistor is a first N channel MOS transistor having a source connected to a ground, a gate connected to an output of said second inverter and a drain connected to said output terminal, said protection circuit comprises a second P channel MOS transistor having a source connected to said output of said first inverter, a gate connected to said power source and a drain connected to said output terminal, a third P channel MOS transistor having a source connected to said power source, a gate connected to said output terminal and a drain and a well connected to wells of said first and second P channel transistors, respectively, and a fourth P channel MOS transistor having a source connected to said output of said first inverter, a gate connected to said input terminal and a drain and a well commonly connected to said well of said third P channel transistor, said control circuit comprises a fifth P channel MOS transistor having a source connected to said power source and a gate connected to said input terminal, a sixth P channel MOS transistor having a source connected to said power source and a gate connected to said output of said third inverter, a seventh P channel MOS transistor having a source connected to said drain of said sixth P channel MOS transistor, a gate connected to said output of said transfer gate and said gate of said first P channel MOS transistor, a drain connected to said drain of said fifth P channel MOS transistor and a well connected to said well of said first P channel MOS transistor, and a second N channel MOS transistor having a source connected to said output of said first inverter, a gate connected to said gate of said seventh P channel MOS transistor and a drain connected to said drain of said seventh P channel transistor, and said transfer gate comprises an eighth P channel MOS transistor having a gate connected to said output terminal and a well connected to said well of said first P channel MOS transistor and a third N channel MOS transistor having a gate connected to said drain of said seventh P channel MOS transistor and a source and a drain connected to said source and said drain of said eighth P channel MOS transistor as an input and an output of said transfer gate, respectively.

10. An output circuit as claimed in claim 9, wherein said output buffer circuit comprises an NPN transistor having a collector connected to said power source, a base connected to said source of said first P channel MOS transistor and an emitter connected to said output terminal, and a buffer circuit having an input connected to said input terminal and an output connected to said base of said NPN transistor and said source of said first P channel MOS transistor.

* * * * *